United States Patent
Yang et al.

(10) Patent No.: US 9,812,854 B2
(45) Date of Patent: Nov. 7, 2017

(54) POWER SUPPLY DEVICE AND HIGH POTENTIAL TEST METHOD THEREOF

(71) Applicant: DELTA ELECTRONICS, INC., Taoyuan (TW)

(72) Inventors: Shan-Chun Yang, Taoyuan (TW); Cheng-Chun Lin, Taoyuan (TW); Yi-Hua Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 36 days.

(21) Appl. No.: 15/013,941

(22) Filed: Feb. 2, 2016

(65) Prior Publication Data
US 2016/0359316 A1 Dec. 8, 2016

(30) Foreign Application Priority Data
Jun. 3, 2015 (TW) .............................. 104117923 A

(51) Int. Cl.
| | | |
|---|---|---|
| *G01R 31/40* | (2014.01) | |
| *G01R 31/02* | (2006.01) | |
| *H02H 3/22* | (2006.01) | |
| *H05K 1/02* | (2006.01) | |
| *H02H 7/125* | (2006.01) | |
| *H05K 7/14* | (2006.01) | |
| *G01R 31/42* | (2006.01) | |

(52) U.S. Cl.
CPC ............. *H02H 3/22* (2013.01); *G01R 31/025* (2013.01); *G01R 31/40* (2013.01); *G01R 31/42* (2013.01); *H02H 7/1252* (2013.01); *H05K 1/0215* (2013.01); *H05K 7/142* (2013.01); *H05K 7/1427* (2013.01)

(58) Field of Classification Search
CPC ...... G01R 31/025; H02H 3/22; H02H 7/1252; H05K 1/0215; H05K 7/1427
USPC .................................... 324/764.01, 527, 713
See application file for complete search history.

(56) References Cited

U.S. PATENT DOCUMENTS 5,991,164 A * 11/1999 Saito ......................... H01T 4/08
174/51

FOREIGN PATENT DOCUMENTS

| CN | 201557319 U | 8/2010 |
| CN | 202076941 U | 12/2011 |

* cited by examiner

*Primary Examiner* — Amy He
(74) *Attorney, Agent, or Firm* — Muncy, Geissler, Olds & Lowe, P.C.

(57) ABSTRACT

A power supply device is disclosed. A circuit board is disposed inside a conductive housing. A rectifying module is disposed on the circuit board and has primary and secondary sides. The grounding module includes a first grounding element, a second grounding element, and a fastening element. Two terminals of the first surge protection module are respectively electrically connected to the primary side and the first grounding element. Two terminals of the second surge protection module are respectively electrically connected to the secondary side and the second grounding element. The second grounding element and the first grounding element are not directly connected. The fastening element passes through the conductive housing, the circuit board, the first grounding element, and the second grounding element so that the conductive housing, the first grounding element, and the second grounding element are electrically connected to one another.

12 Claims, 9 Drawing Sheets

POWER SUPPLY DEVICE AND HIGH POTENTIAL TEST METHOD THEREOF

CROSS REFERENCE TO RELATED APPLICATIONS

This Non-provisional application claims priority under 35 U.S.C. §119(a) on Patent Application No(s). 104117923 filed in Taiwan, Republic of China on Jun. 3, 2015, the entire contents of which are hereby incorporated by reference.

BACKGROUND OF THE INVENTION

Field of Invention

The invention relates to a power supply device and a high potential test method thereof.

Related Art

As to currently common electronic devices, most of them convert utility power into direct current power by a power supply device and use it as working power for itself. A surge protector is generally installed at the primary side of power supply device to short or bypass high voltage surges caused by lightning to ground, thereby preventing an electronic component from damage caused by lightning surge.

Moreover, when the power supply device is not connected to a load, the power supply device may be damaged caused by the voltage spikes due to the lightning surge at the secondary side. Therefore, the secondary side of the power supply device may be equipped with the surge protector to avoid lightning surges entering the circuit from the primary side or the secondary side. However, when the secondary side of the power supply device is also equipped with the surge protector, it is necessary to additionally design the configuration of the circuit and add a ground structure. It results in the increase of material and cost and also occupies the space inside the power supply device.

Further, to ensure that the power supply device meets the safety standards, the insulation test is performed on the power supply device during production. As to the test, a high voltage is provided to test whether the leakage current will occur respectively for "the primary side relative to the ground", "the secondary side relative to the ground", and "the primary side relative to the secondary side". However, during the high potential test, it will cause the surge protector to work so the test fails. Thus, before performing the high potential test, the circuit of the surge protector should be disconnected to the ground to avoid the actuation of the surge protector.

Therefore, it is an important subject to provide a power supply device and a high potential test method thereof. When its secondary side is equipped with the surge protector, the space for grounding can be saved. Moreover, the inside surge protector can be temporarily disconnected to the ground to avoid the actuation of the surge protector during the high potential test.

SUMMARY OF THE INVENTION

An objective of the invention is to provide a power supply device and a high potential test method thereof which can save the space for grounding when the secondary side is equipped with the surge protector and disconnect the inside surge protector and the ground to avoid the actuation of the surge protector during the high potential test.

A power supply device according to the invention includes a conductive housing, a circuit board, a rectifying module, a first surge protection module, a second surge protection module, and a grounding module. The circuit board is disposed inside the conductive housing. The rectifying module is disposed on the circuit board and has a primary side and a secondary side. One terminal of the first surge protection module is electrically connected to the primary side. One terminal of the second surge protection module is electrically connected to the secondary side. The grounding module includes a first grounding element, a second grounding element, and a fastening element. The first grounding element is electrically connected to the other terminal of the first surge protection module. The second grounding element is electrically connected to the other terminal of the second surge protection module. The second grounding element and the first grounding element are not directly connected. The fastening element passes through the conductive housing, the circuit board, the first grounding element, and the second grounding element so that the conductive housing, the first grounding element, and the second grounding element are electrically connected to one another.

In one embodiment, the first grounding element includes a first fixing portion and a first inserting portion. The first fixing portion is opposite to the circuit board. The first fixing portion has a first opening. The fastening element passes through the first opening. The first inserting portion is extended from the first fixing portion to the circuit board and the first inserting portion is inserted into the circuit board.

In one embodiment, the second grounding element includes a second fixing portion and a second inserting portion. The second fixing portion is opposite to the circuit board. The second fixing portion has a second opening. The fastening element passes through the second opening. The second inserting portion is extended from the second fixing portion to the circuit board, and the second inserting portion is inserted into the circuit board.

In one embodiment, the circuit board has a first electrical connection hole and a second electrical connection hole. The first inserting portion has a first pin, and the second inserting portion has a second pin. The first pin is inserted into the first electrical connection hole, and the second pin is inserted into the second electrical connection hole.

In one embodiment, the size of the first pin is different from that of the second pin.

In one embodiment, the grounding module further includes an insulation element which carries and fixes the first grounding element and the second grounding element. The fastening element passes through the insulation element.

In one embodiment, the insulation element includes a bottom surface, a first carrying portion, and a second carrying portion. The bottom surface abuts the circuit board. The first carrying portion is opposite to the bottom surface. The first fixing portion is disposed on the first carrying portion. The second carrying portion is opposite to the bottom surface. The second fixing portion is disposed on the second carrying portion. The distance from the bottom surface to the first carrying portion is different from that from the bottom surface to the second carrying portion.

In one embodiment, the first carrying portion has a first engagement portion engaging with the first grounding element. The second carrying portion has a second engagement portion engaging with the second grounding element.

In one embodiment, the power supply device further includes a spacer disposed between the conductive housing and the circuit board.

A high potential test method for a power supply device according to the invention is provided. The power supply device includes a conductive housing, a rectifying module, a first surge protection module, and a second surge protection module. The first surge protection module is connected to the primary side of the rectifying module, and the second surge protection module is connected to the secondary side of the rectifying module. The high potential test method includes: keeping the first surge protection module and the second surge protection module electrically floating; providing a high potential test power, wherein one terminal of the high potential test power is connected to the primary side, and the other terminal is connected to the secondary side; providing a high voltage for the power supply device by the high potential test power and lasting for a predetermined time; removing the high potential test power after the predetermined time; and fastening a fastening element to the conductive housing, wherein the fastening element passes through a first grounding element electrically connected to the first surge protection module and a second grounding element electrically connected to the second surge protection module so that the conductive housing, the first grounding element, and the second grounding element have equal electrical potentials.

In one embodiment, before the step of fastening the fastening element to the conductive housing, the method further includes: connecting one terminal of the high potential test power to the primary side and grounding the other terminal; providing the high voltage for the power supply device by the high potential test power and lasting for another predetermined time; and removing the high potential test power after another predetermined time.

In one embodiment, before the step of fastening the fastening element to the conductive housing, the method further includes: connecting one terminal of the high potential test power to the secondary side and grounding the other terminal; providing the high voltage for the power supply device by the high potential test power and lasting for another predetermined time; and removing the high potential test power after another predetermined time.

As mentioned above, as to the power supply device according to the invention, because of the design of the grounding module, instead of connecting to the conductive housing to ground respectively by multiple individual fastening elements, the first surge protection module and the second surge protection module can share the same grounding terminal by the single fastening element which passes through the first grounding element, the second grounding element, and the conductive housing simultaneously. Therefore, the amount of the used fastening elements can be reduced, and the space for use inside the power supply device can be saved. Further, when the high potential test is performed during producing, the fastening element can loose and be removed first to make the first grounding element, the second grounding element, and the conductive housing not to be electrically connected to one another and thus to be disconnected to the ground. After the high potential test, the fastening element is fastened from the outside of the conductive housing toward the inside, so that the first grounding element, the second grounding element, and the conductive housing are electrically connected to one another and ground, thus simplifying the testing process.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
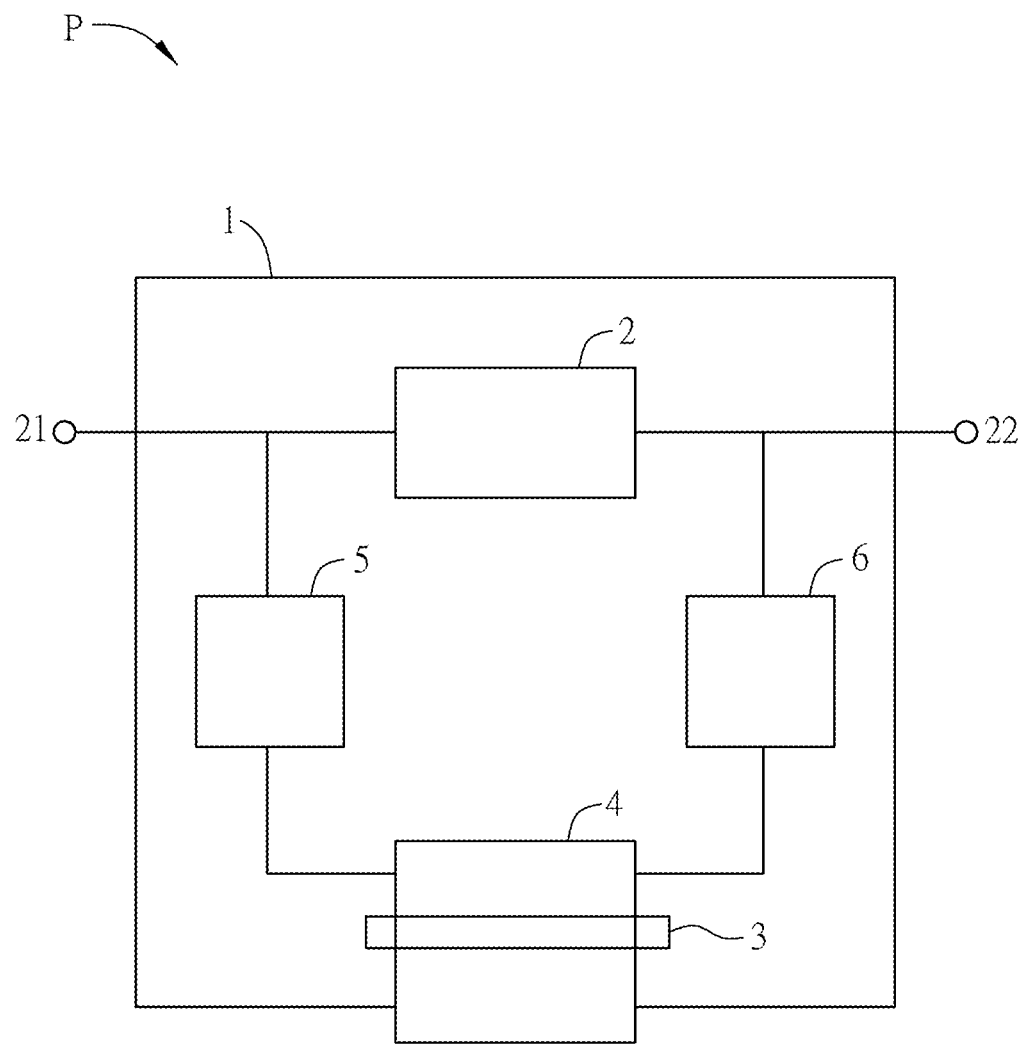
FIG. 1A is a block diagram of a power supply device according to a preferred embodiment of the invention.
Figure 1B:
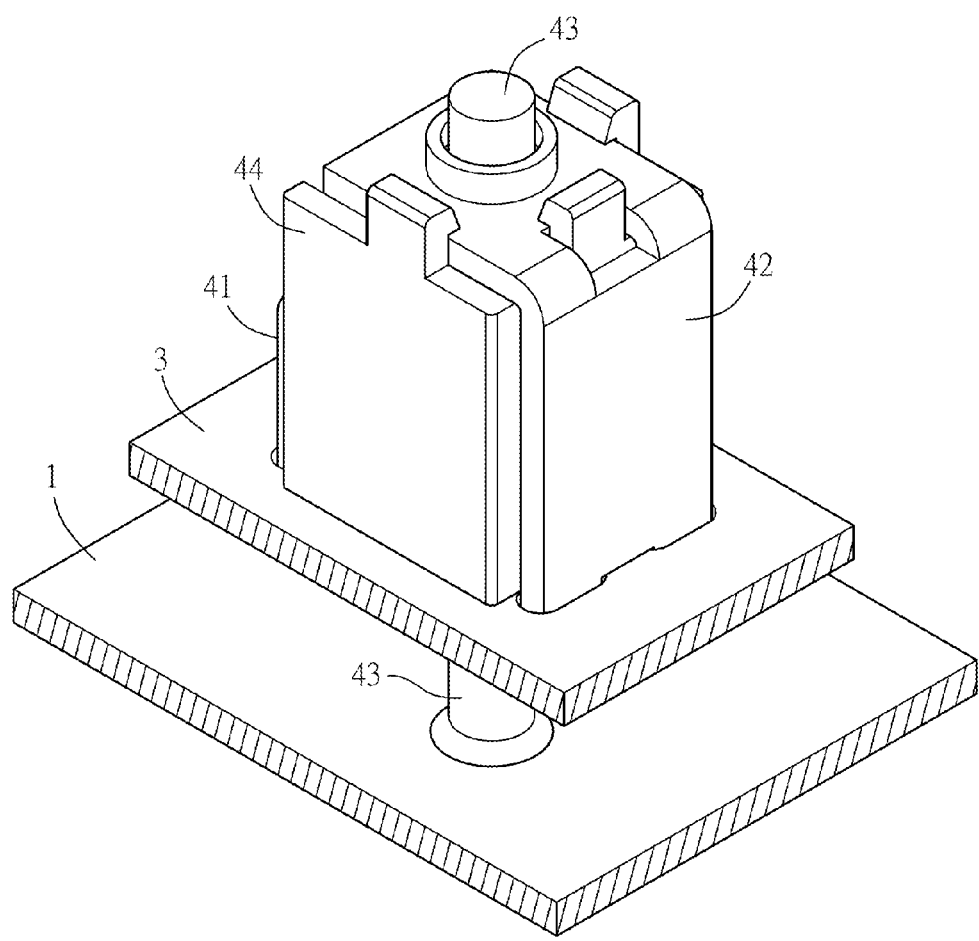
FIG. 1B is an assembly diagram of the ground structure of the power supply device shown in FIG. 1A.
Figure 1C:
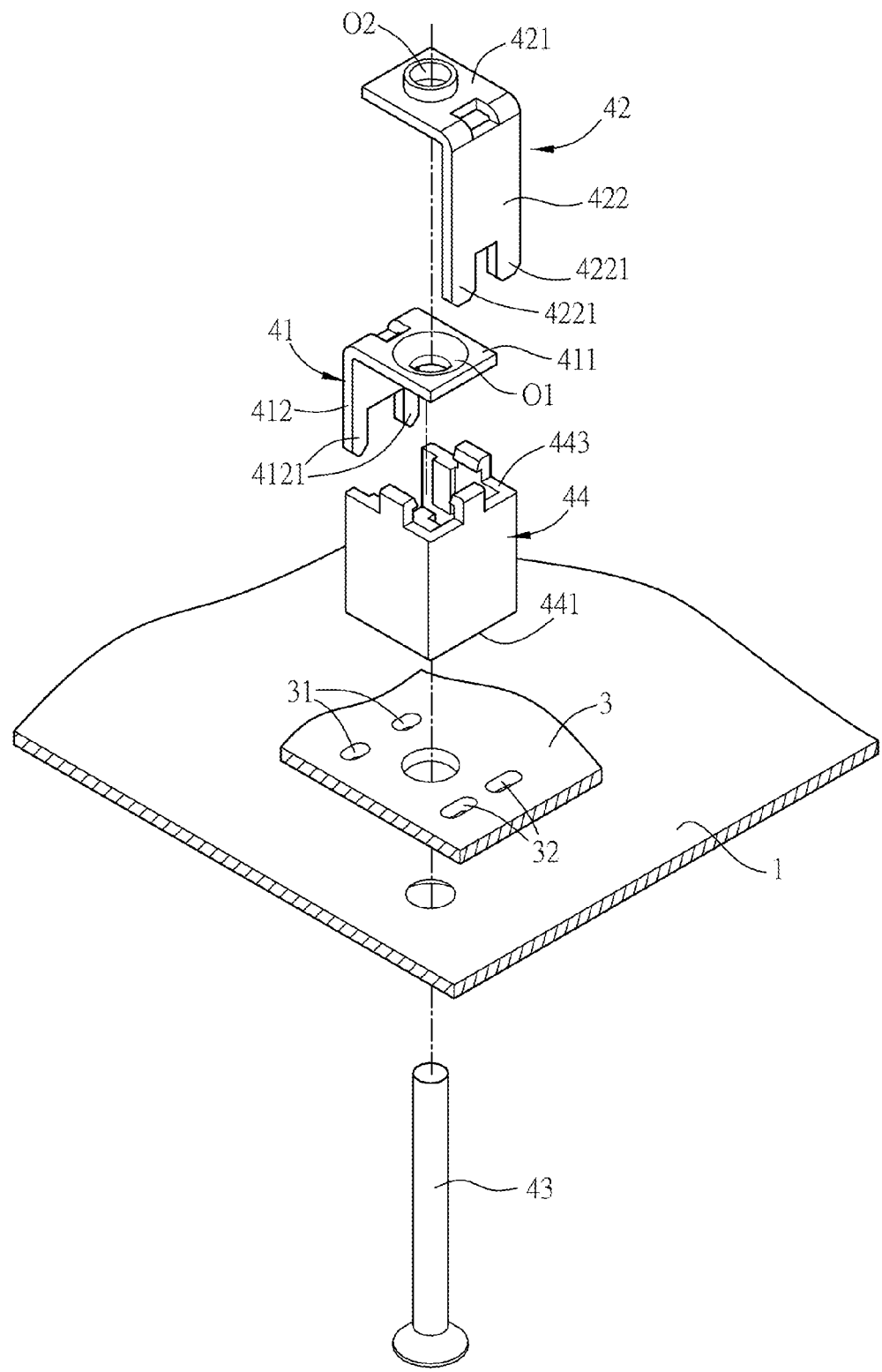
FIG. 1C an exploded view of the ground structure shown in FIG. 1B.
Figure 1D:
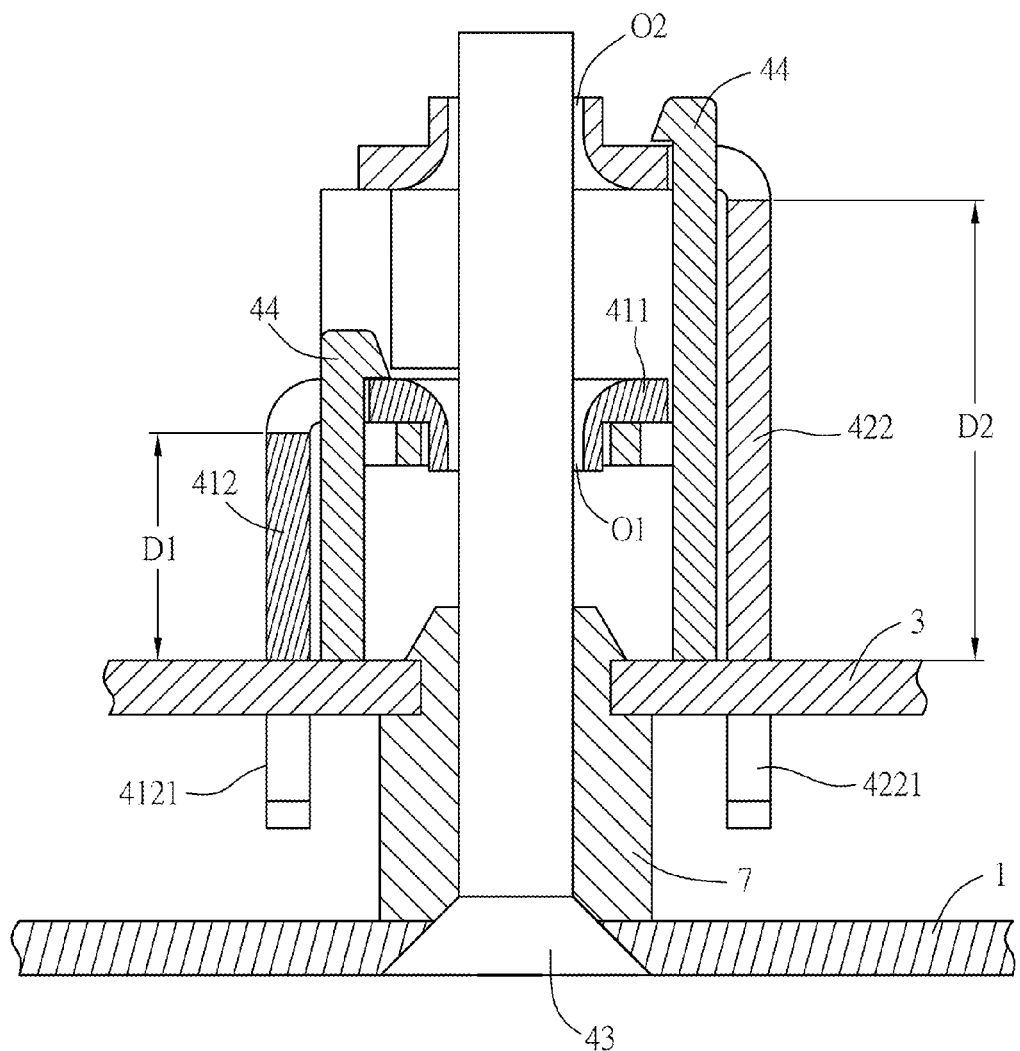
FIG. 1D is a sectional view of the ground structure shown in FIG. 1B.

FIG. 1A is a block diagram of a power supply device according to a preferred embodiment of the invention, FIG. 1B is an assembly diagram of the ground structure of the power supply device shown in FIG. 1A, FIG. 1C an exploded view of the ground structure shown in FIG. 1B, and FIG. 1D is a sectional view of the ground structure shown in FIG. 1B. Referring to FIGS. 1A, 1B, 1C, and 1D, the power supply device P includes a conductive housing 1, a rectifying module 2, a circuit board 3, a grounding module 4, a first surge protection module 5, and a second surge protection module 6. In the embodiment, the conductive housing 1 is the outer structure of the power supply device P. It accommodates the rectifying module 2, the circuit board 3, the first surge protection module 5, and the second surge protection module 6. The conductive housing 1 is conductive material, preferably metal, to protect the inside components of the power supply device P from being directly struck by external force.

The rectifying module 2 has a primary side 21 and a secondary side 22. In the embodiment, the primary side 21 includes a live line and a neutral line which can be correspondingly connected to utility power or other alternating current power, namely the input terminal of the power supply device P. The secondary side 22 includes a high potential terminal and a low potential terminal to provide direct current to a load, namely the output terminal of the power supply device P. Moreover, the rectifying module 2 may include a plurality of coils, a plurality of diodes, and the like to rectify alternating current to direct current. Its composition and connection between elements are known in the art, they are not repeat here.

The grounding module 4 includes a first grounding element 41, a second grounding element 42, and a fastening element 43. The first grounding element 41 and the second grounding element 42 are respectively electrically connected to the circuit board 3, and the second grounding element 42 and the first grounding element 41 are not directly connected to each other. The fastening element 43 is conductive material, and it is fastened from the outside of the conductive housing 1 toward the inside and passes through the conductive housing 1, the circuit board 3, the first grounding element 41, and the second grounding element 42 in turn, so that the potentials of the conductive housing 1, the first grounding element 41, and the second grounding element 42 are equal. A screw is taken for example in this embodiment.

The surge protection module can prevent the damage caused by lightening or other overvoltage which invades the apparatus, and it can release a large number of pulse energy induced by lightening on the circuit into the earth in the shortest time by short circuit to reduce the potential difference between each interface in the apparatus, thereby protecting the electronic components. In the embodiment, it is two surge protection modules for example. In detail, the first surge protection module 5 is disposed inside the conductive housing 1, one terminal is electrically connected to the primary side 21 of the rectifying module 2, and the other terminal is electrically connected to the first grounding element 41 of the grounding module 4. In the embodiment, the first surge protection module 5 is coupled to the circuit board 3 and electrically connected to the first grounding element 41 by a wire and an electronic component on the circuit board 3. Similarly, the second surge protection module 6 is disposed inside the conductive housing 1, one terminal is electrically connected to the secondary side 22 of the rectifying module 2, and the other terminal is electrically connected to the second grounding element 42 of the grounding module 4. In the embodiment, the second surge protection module 6 is coupled to the circuit board 3 and electrically connected to the second grounding element 42 by a wire and an electronic component on the circuit board 3. As a result, when the power supply device P is affected by lightning, the first surge protection module 5 or the second surge protection module 6 will be actuated, so that pulse energy can be transferred to the conductive housing 1 by the grounding module 4, and thus discharged into the earth.

In the embodiment, the first grounding element 41 is a sheet which is generally L-shape and includes a first fixing portion 411 and a first inserting portion 412. The first fixing portion 411 is opposite to the circuit board 3. Namely, the first fixing portion 411 is parallel to the circuit board 3. The first fixing portion 411 has a first opening O1, and the fastening element 43 passes through the first opening O1. The first inserting portion 412 is extended from the first fixing portion 411 to the circuit board 3. Namely, the first inserting portion 412 is perpendicular to the first fixing portion 411, and the first inserting portion 412 is inserted into the circuit board 3. Here, the first inserting portion 412 of the embodiment is also perpendicular to the circuit board 3.

Similarly, the second grounding element 42 is also a sheet which is generally L-shape and includes a second fixing portion 421 and a second inserting portion 422. The second fixing portion 421 is opposite to the circuit board 3. Namely, the second fixing portion 421 is parallel to the circuit board 3. The second fixing portion 421 has a second opening O2 and the fastening element 43 passes through the second opening O2. The second inserting portion 422 is extended from the second fixing portion 421 to the circuit board 3. Namely, the second inserting portion 422 is perpendicular to the second fixing portion 421, and the second inserting portion 422 is inserted into the circuit board 3. Here, the second inserting portion 422 of the embodiment is perpendicular to the circuit board 3.

It should be noted that, in the embodiment, the second fixing portion 421 of the second grounding element 42 is higher than the first fixing portion 411 of the first grounding element 41. Namely, the length of the second inserting portion 422 is longer than that of the first inserting portion 412. In other words, the projection of the first fixing portion 411 onto the circuit board 3 and that of the second fixing portion 421 onto the circuit board 3 roughly overlap. Certainly, in other embodiments, it may also be that the length of the first inserting portion 412 is longer than that of the second inserting portion 422, so that the first fixing portion 411 is higher than the second fixing portion 421, it is not limited thereto.

Furthermore, in the embodiment, the first inserting portion 412 is opposite to and parallel to the second inserting portion 422. In other embodiments, they may be perpendicular to each other, or alternatively not perpendicular and not parallel.

The circuit board 3 has at least one first electrical connection hole 31 and at least one second electrical connection hole 32, the first inserting portion 412 has at least one first pin 4121, and the second inserting portion 422 has at least one second pin 4221. Here, the first pin 4121 is inserted into the first electrical connection hole 31, and the second pin 4221 is inserted into the second electrical connection hole 32. In the embodiment, two first pins 4121 are inserted into two first electrical connection holes 31, and two second pins 4221 are inserted into two second electrical connection holes 32 for example. It should be noted that the first electrical connection hole 31 may be electrically connected to the first surge protection module 5 by a printed circuit, an electronic component, or a wire, and the second electrical connection hole 32 may also be electrically connected to the second surge protection module 6 by a printed circuit, an electronic component, or a wire.

Overall, the surge protection modules respectively at the input terminal and the output terminal of the power supply device P benefits that the power supply device P and the connected electrical load thereof can be further protected from lightning strike when using the power supply device P outdoors. Moreover, instead of connecting to the conductive housing 1 to ground respectively by multiple individual fastening elements, the first surge protection module 5 and the second surge protection module 6 can share the same grounding terminal by the single fastening element 43 which is fastened from the outside of the conductive housing 1 and passes through the first grounding element 41, the second grounding element 42, and the conductive housing 1 simultaneously. Therefore, the space for use inside the power supply device P can be saved. It should be noted that when the high potential test (also known as hi-pot test) is performed on the power supply device P, the fastening element 43 can be removed first and not be fastened to keep the first surge protection module 5 and the second surge protection module 6 electrically floating. Therefore, the primary side and ground, the secondary side and ground, and the primary side and the secondary side all are disconnected. After the high potential test, the fastening element 43 is then fastened to the determined position in order for the first surge protection module 5 and the second surge protection module 6 to be grounded and operate regularly. Accordingly, compared with the conventional ground, by the design of the grounding module 4 in the embodiment, the space for use inside the power supply device P can be saved, and the assembly steps after the high potential test can be simplified, thereby reducing the overall producing cost.

Figure 2A:
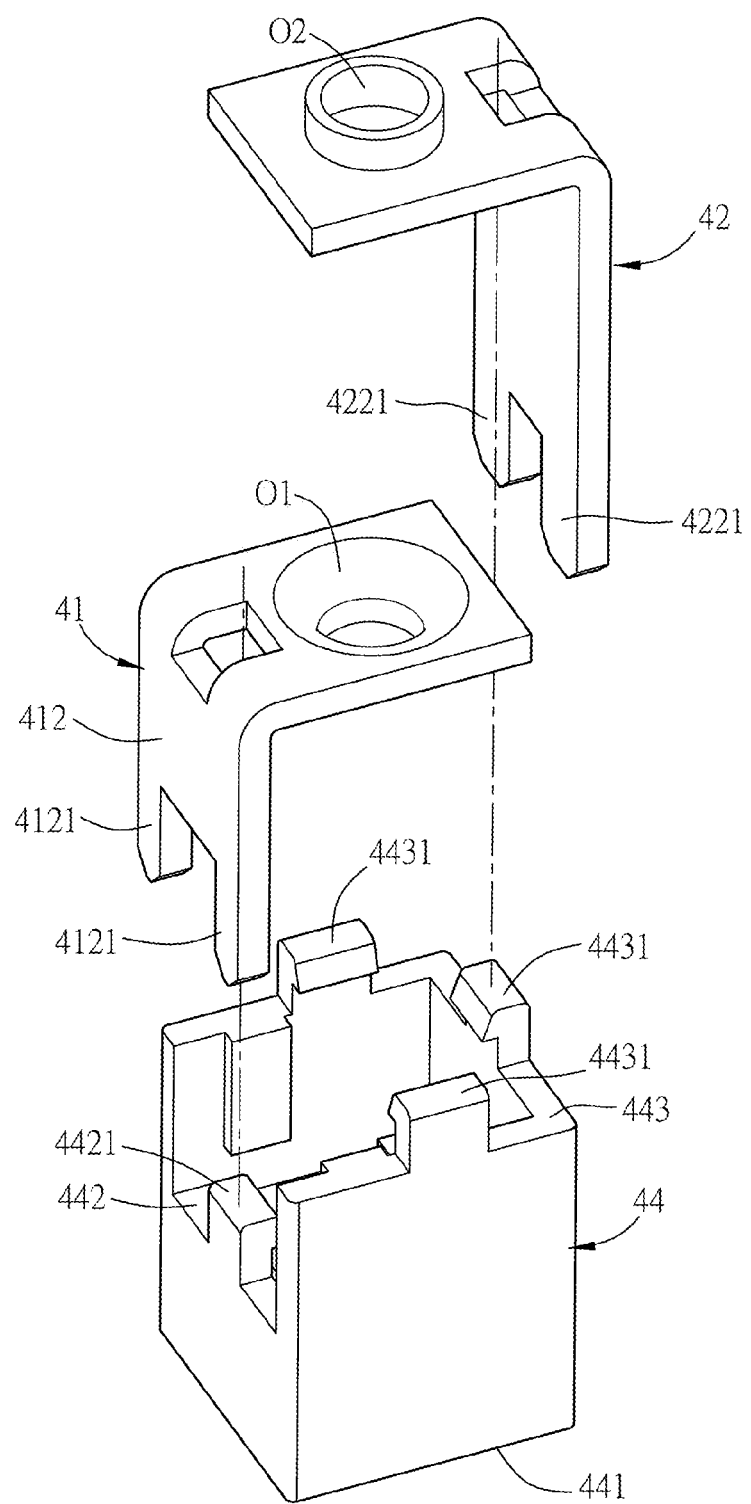
FIG. 2A is a partial exploded view of the ground structure.
Figure 2B:
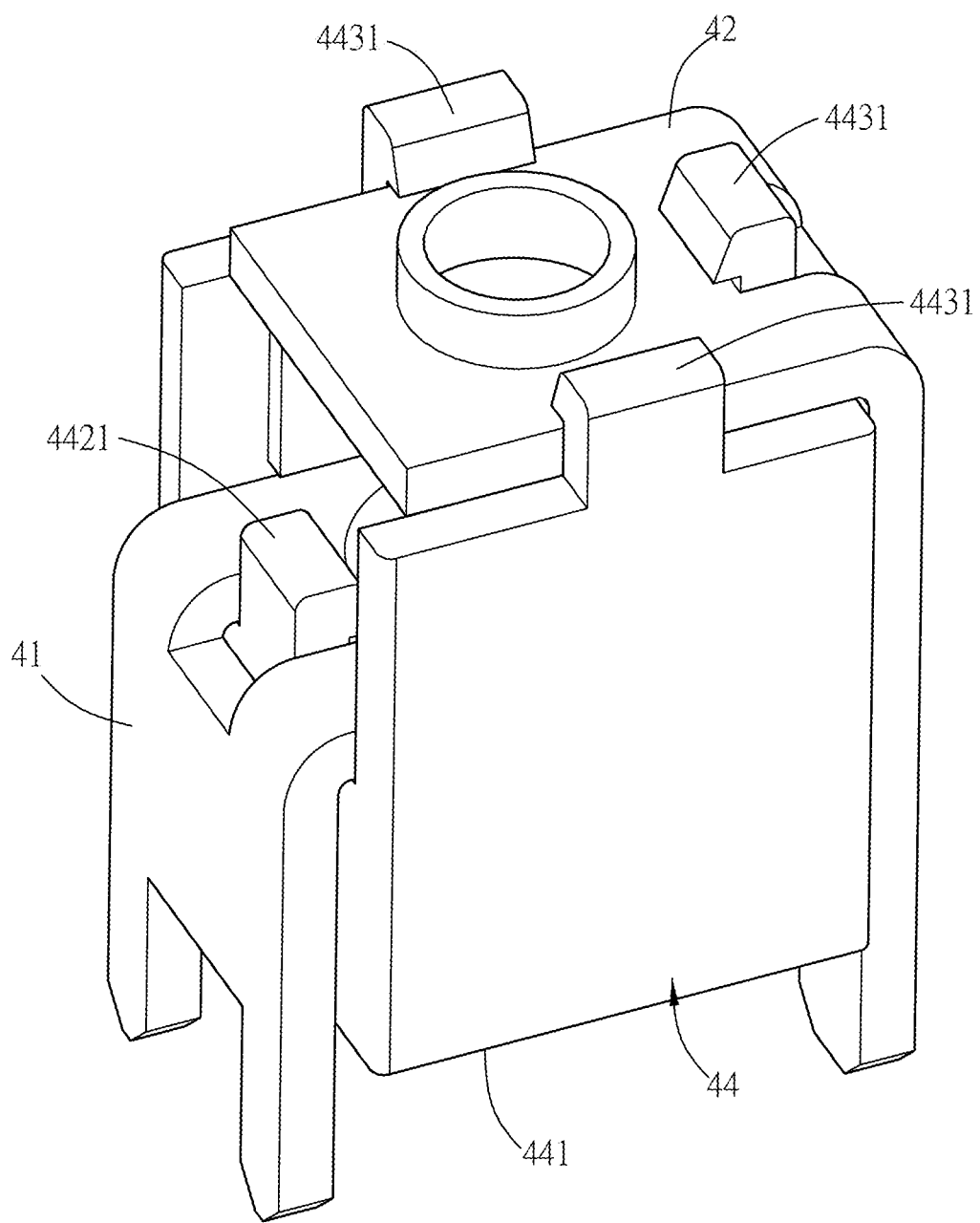
FIG. 2B is a partial assembly diagram of the ground structure.

FIG. 2A is a partial exploded view of the ground structure, and FIG. 2B is a partial assembly diagram of the ground structure. Referring to FIGS. 1A, 1B, 1C, 1D, 2A, and 2B, in the embodiment, the grounding module 4 further includes an insulation element 44 which carries and fixes the first grounding element 41 and the second grounding element 42, and the fastening element 43 passes through the insulation element 44. In detail, the insulation element 44 includes a bottom surface 441, a first carrying portion 442, and a second carrying portion 443. The bottom surface 441 abuts the circuit board 3. In addition, it can also be fixed on the circuit board 3 by a viscose. The first carrying portion 442 is opposite to the bottom surface 441, namely they are parallel to each other, and the first fixing portion 411 is disposed on the first carrying portion 442. The second carrying portion 443 is also opposite to the bottom surface 441, and the second fixing portion 421 is disposed on the second carrying portion 443. The distance D1 from the bottom surface 441 to the first carrying portion 442 is different from the distance D2 from the bottom surface 441 to the second carrying portion 443, and the distance D1 is smaller than the distance D2 for example in the embodiment. Furthermore, the shape of the insulation element 44 may generally be a hollow cylindrical, a hollow square column, or other hollow polygonal columns, and the square column is taken for example in the embodiment.

Moreover, the first carrying portion 442 may have a first engagement portion 4421 which engages with the first grounding element 41. In the embodiment, the first engagement portion 4421 is a protruding barb structure, and the bend of the first grounding element 41 (i.e. the junction between the first fixing portion 411 and the first inserting portion 412) has a hole. Therefore, the first engagement portion 4421 can pass through the hole and engages with and fixes the first grounding element 41 by the barb.

Similarly, the second carrying portion 443 may also have a second engagement portion 4431 which engages with the second grounding element 42. In the embodiment, the second engagement portion 4431 has three protruding barb structures which are respectively located on three adjacent sides of the insulation element 44, and the bend of the second grounding element 42 (i.e. the junction between the second fixing portion 421 and the second inserting portion 422) has a hole. Therefore, one of the protruding barb structures of the second engagement portion 4431 can pass through the hole, and it engages with and fixes the second grounding element 42 by the barb. The other two protruding barb structures engages with and fix the edge of the second fixing portion 421.

Moreover, the power supply device P may further include a spacer 7 which is disposed between the conductive housing 1 and the circuit board 3 to prevent the conductive housing 1 from directly contact with the circuit board 3 and accordingly to avoid the electronic component or the wire on the circuit board 3 being shorted. In the embodiment, the fastening element 43 further passes through the spacer 7.

In some embodiments, the size of the first pin 4121 may be different from that of the second pin 4221 or the interval between each first pin 4121 is different from that of each second pin 4221 that acts as a poka-yoke measure which can avoid the misplacement of the first grounding element 41 and the second grounding element 42 during assembling by a worker.

Figure 3A:
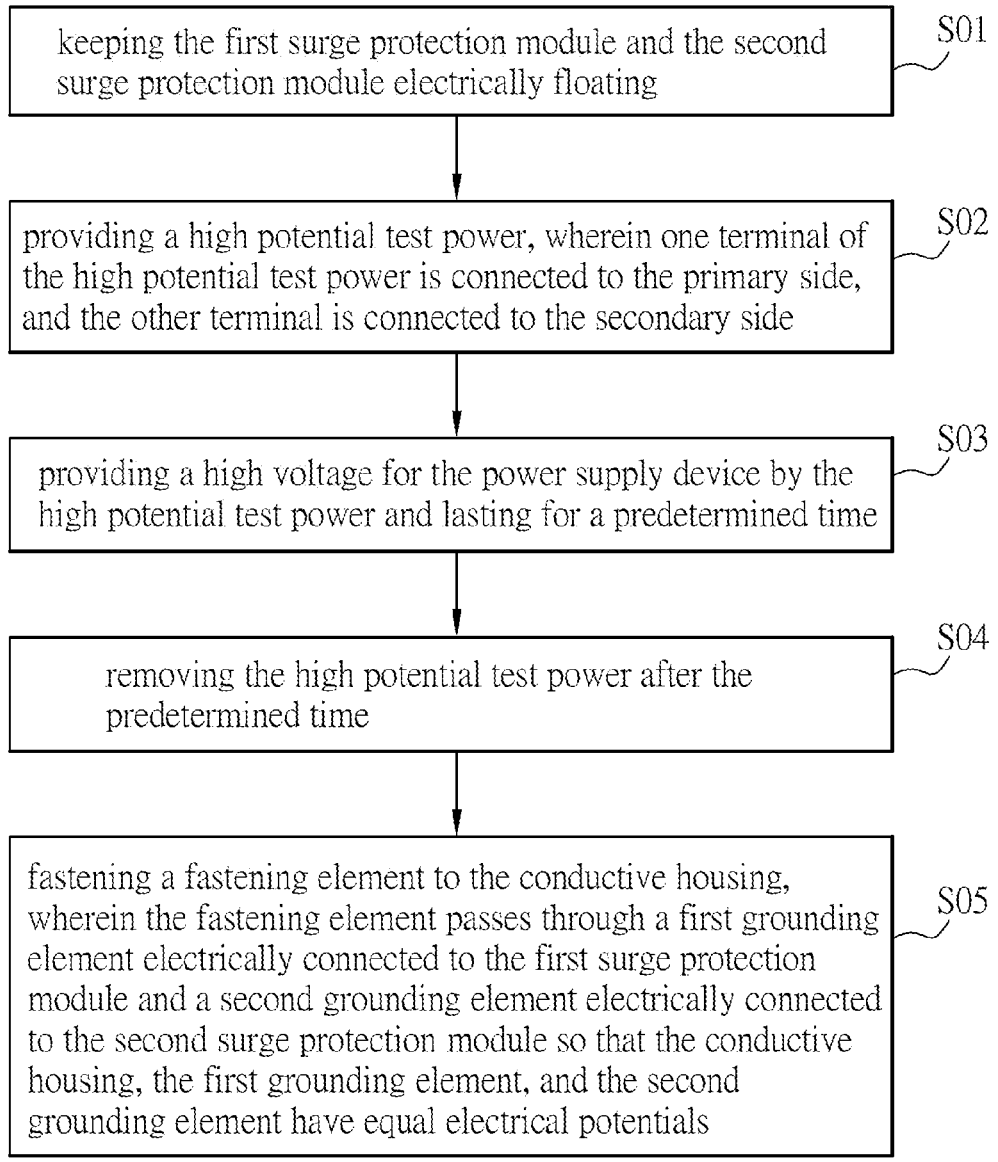
FIG. 3A is a flow chart of a high potential test method according to a preferred embodiment of the invention.

Referring to FIG. 3A, it is a flow chart of a high potential test method according to a preferred embodiment of the invention. A high potential test method is provided which is adapted to the power supply device P described above. The composition and the description of the power supply device P are described above in detail, and they are not repeated here. Here, the high potential test method includes following steps: keeping the first surge protection module and the second surge protection module electrically floating (S01); providing a high potential test power, wherein one terminal of the high potential test power is connected to the primary side, and the other terminal is connected to the secondary side (S02); providing a high voltage for the power supply device by the high potential test power and lasting for a predetermined time (S03); removing the high potential test power after the predetermined time (S04); and fastening a fastening element to the conductive housing, wherein the fastening element passes through and a first grounding element electrically connected to the first surge protection module and a second grounding element electrically connected to the second surge protection module so that the conductive housing, the first grounding element, and the second grounding element have equal electrical potentials (S05).

Figure 3B:
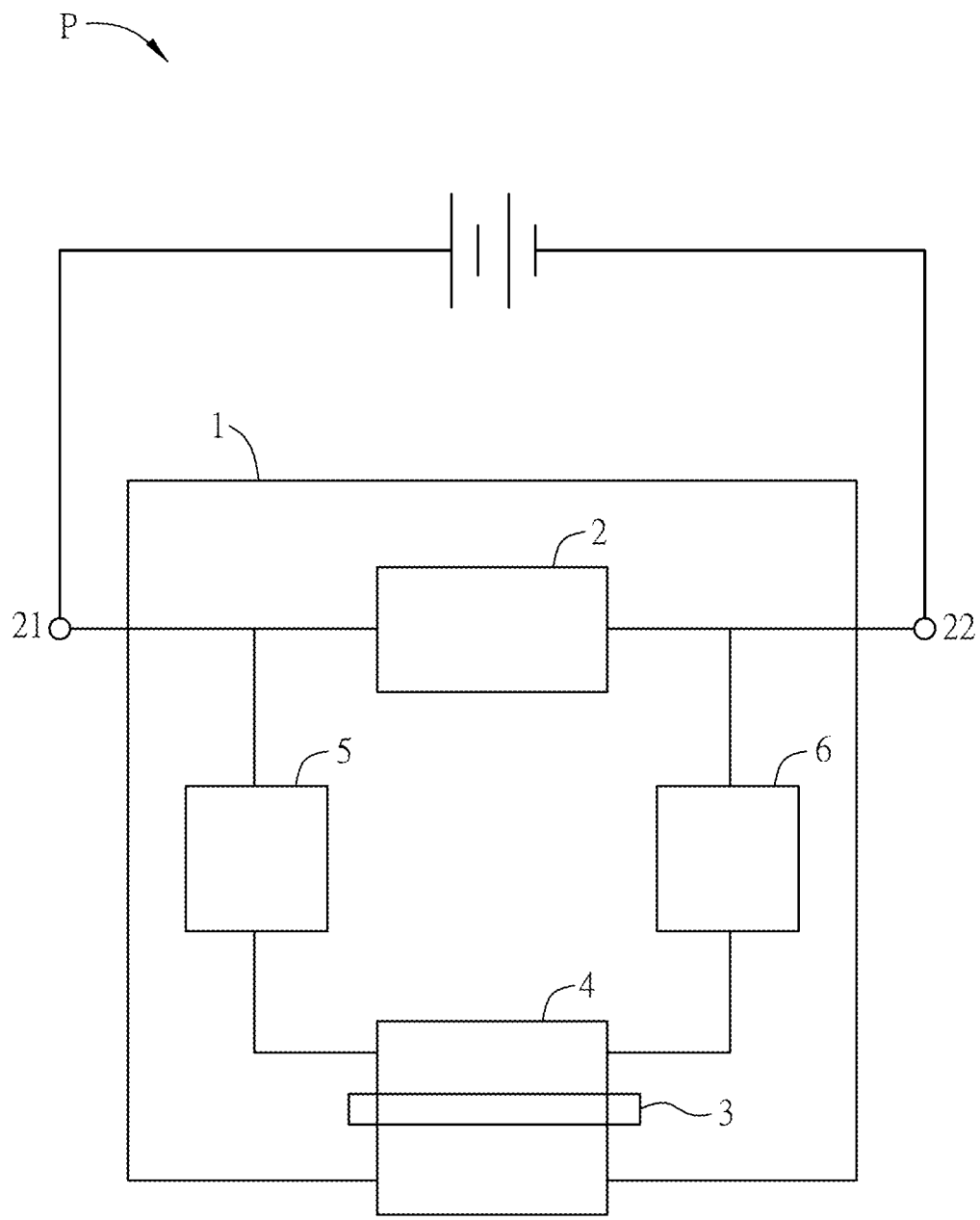
FIG. 3B is a block diagram of the high potential test.

In the step S01, to remove the fastening element 43 or not to assemble the fastening element 43 first during manufacturing can keep the surge protection module to be electrically floating. In the step S02, the high potential test power may, for example, be direct current power of 4242 V or alternating current power of 3000 V. Then, referring to FIG. 3B, the high potential test power is bridged over the primary side 21 and the secondary side 22, namely bridged over the input terminal and the output terminal of the power supply device P, to test whether the power supply device P meets the norm of safety. Subsequently, in the steps S03 and S04, after a high voltage is provided for the power supply device P by the high potential test power described above for a period of time for example one minute, the high potential test power is removed and the testing process is complete. Finally, as described in the step S05, the fastening element 43 is fastened to electrically connect the first grounding element 41 and the second grounding element 42 to the conductive housing 1 for grounding, so it can enable the surge protection module to operate regularly.

Figure 3C:
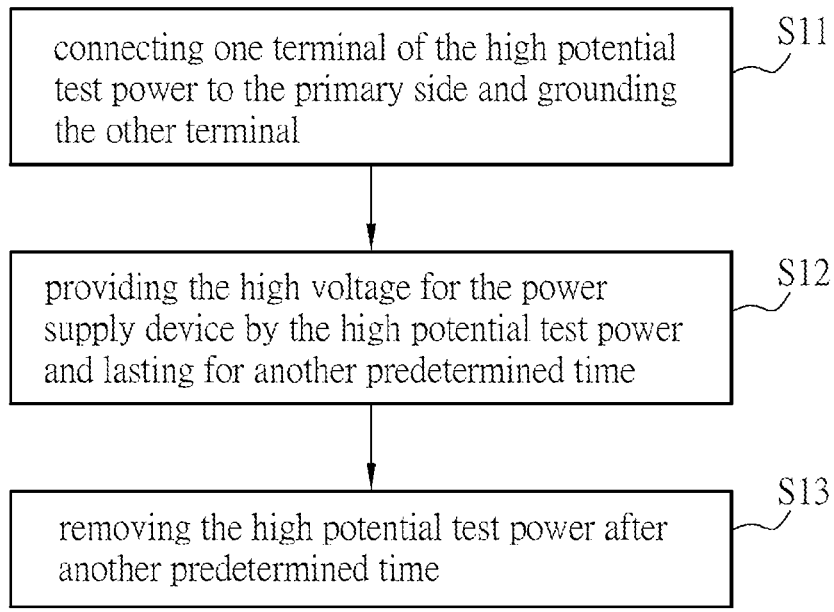
FIG. 3C is a flow chart of other steps of the high potential test method.

Moreover, referring to FIG. 3C, it is a flow chart of other steps of the high potential test method. Before the step S05, the high potential test method may further include: performing the test for the primary side relative to the ground which includes: connecting one terminal of the high potential test power to the primary side and grounding the other terminal (S11); providing the high voltage for the power supply device by the high potential test power and lasting for another predetermined time (S12); and removing the high potential test power after another predetermined time (S13).

In the step S11, the ground of the high potential test power may be connected to the conductive housing 1 or connected to the other grounds of the power supply device P in order for the voltage to be bridged over the primary side 21 and the ground. Then, steps S12 and S13 are performed. After the high voltage is provided for the power supply device P by the high potential test power for a period of time for example one minute, the high potential test power is removed and the high potential testing process of "the primary side relative to ground" is complete.

Figure 3D:
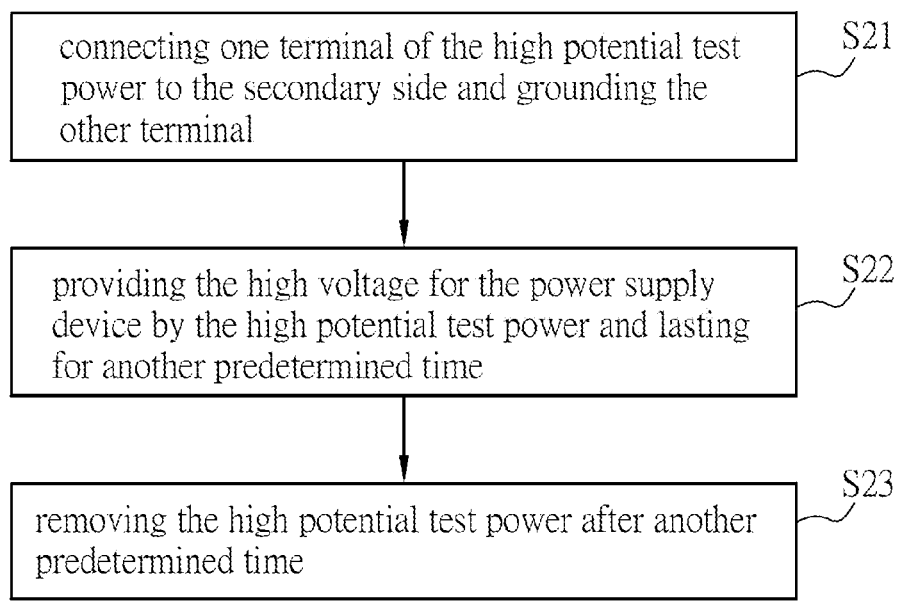
FIG. 3D is a flow chart of other steps of the high potential test method.

Moreover, referring to FIG. 3D, it is a flow chart of other steps of the high potential test method. Similarly, before the step S05, the high potential test method may include: performing the test for the secondary side relative to the ground which includes: connecting one terminal of the high potential test power to the secondary side and grounding the other terminal (S21); providing the high voltage for the power supply device by the high potential test power and lasting for another predetermined time (S22); and removing the high potential test power (S23) after the predetermined time. Here, the test method for "the secondary side relative to the ground" is generally the same as "the primary side relative to the ground" described above, the difference is only that one terminal of the high potential test power is connected to the secondary side 22 rather than the primary side 21, but the other terminal is still similarly grounded. Because other steps can refer to the above, they are not repeated here.

It should be noted that, in the high potential test method, whether the insulation test for "the primary side relative to the secondary side" described in steps S02-S04, the insulation test for "the primary side relative to the ground" described in steps S11-S13, or the insulation test for "the secondary side relative to the ground" described in steps S21-S23, the order of three insulation tests is not absolute. Firstly performing the insulation test for "the primary side relative to the secondary side" is described in the embodiment for example.

In summary, as to the power supply device according to the invention, because of the design of the grounding module, instead of connecting to the conductive housing to ground respectively by multiple individual fastening elements, the first surge protection module and the second surge protection module can share the same grounding terminal by the single fastening element which passes through the first grounding element, the second grounding element, and the conductive housing simultaneously. Therefore, the amount of the used fastening elements can be reduced, and the space for use inside the power supply device can be saved. Further, when the high potential test is performed during producing, the fastening element can loose and be removed first to make the first grounding element, the second grounding element, and the conductive housing not to be electrically connected to one another and thus to be disconnected to the ground. After the high potential test, the fastening element is fastened from the outside of the conductive housing toward the inside, so that the first grounding element, the second grounding element, and the conductive housing are electrically connected to one another and ground, thus simplifying the testing process.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A power supply device, comprising:
    a conductive housing;
    a circuit board, disposed inside the conductive housing;
    a rectifying module, disposed on the circuit board and having a primary side for input power and a secondary side for a load;
    a first surge protection module, wherein one terminal of the first surge protection module is electrically connected to the primary side;
    a second surge protection module, wherein one terminal of the second surge protection module is electrically connected to the secondary side; and
    a grounding module, comprising:
        a first grounding element, electrically connected to the other terminal of the first surge protection module electrically connected to the primary side of the rectifying module;
        a second grounding element, electrically connected to the other terminal of the second surge protection module electrically connected to the secondary side of the rectifying module, wherein the second grounding element and the first grounding element are not directly connected; and
        a fastening element, passing through the conductive housing, the circuit board, the first grounding element, and the second grounding element so that the conductive housing, the first grounding element, and the second grounding element are electrically connected to one another.

2. The power supply device of claim 1, wherein the first grounding element comprises:
    a first fixing portion, opposite to the circuit board, wherein the first fixing portion has a first opening, and the fastening element passes through the first opening; and
    a first inserting portion, extended from the first fixing portion to the circuit board, wherein the first inserting portion is inserted into the circuit board.

3. The power supply device of claim 2, wherein the second grounding element comprises:
    a second fixing portion, opposite to the circuit board, wherein the second fixing portion has a second opening, and the fastening element passes through the second opening; and
    a second inserting portion, extended from the second fixing portion to the circuit board, wherein the second inserting portion is inserted into the circuit board.

4. The power supply device of claim 3, wherein the circuit board has a first electrical connection hole and a second electrical connection hole, the first inserting portion has a first pin, the second inserting portion has a second pin, the first pin is inserted into the first electrical connection hole, and the second pin is inserted into the second electrical connection hole.

5. The power supply device of claim 4, wherein the size of the first pin is different from that of the second pin.

6. The power supply device of claim 3, wherein the grounding module further comprises an insulation element, the insulation element carries and fixes the first grounding element and the second grounding element, and the fastening element passes through the insulation element.

7. The power supply device of claim 6, wherein the insulation element comprises:
    a bottom surface, abutting the circuit board;
    a first carrying portion, opposite to the bottom surface, wherein the first fixing portion is disposed on the first carrying portion; and
    a second carrying portion, opposite to the bottom surface, wherein the second fixing portion is disposed on the second carrying portion, and the distance from the bottom surface to the first carrying portion is different from that from the bottom surface to the second carrying portion.

8. The power supply device of claim 7, wherein the first carrying portion has a first engagement portion engaging with the first grounding element, and the second carrying portion has a second engagement portion engaging with the second grounding element.

9. The power supply device of claim 1, further comprising a spacer disposed between the conductive housing and the circuit board.

10. A high potential test method for a power supply device, wherein the power supply device comprises a conductive housing, a rectifying module, a first surge protection module, and a second surge protection module, the first surge protection module is connected to the primary side of the rectifying module for input power, the second surge protection module is connected to the secondary side of the rectifying module for a load, and the high potential test method comprises:

keeping the first surge protection module and the second surge protection module electrically floating;

providing a high potential test power, wherein one terminal of the high potential test power is connected to the primary side of the rectifying module, and the other terminal is connected to the secondary side of the rectifying module;

providing a high voltage for the power supply device by the high potential test power and lasting for a predetermined time;

removing the high potential test power after the predetermined time; and after removing the high potential test power, fastening a fastening element to the conductive housing, wherein the fastening element passes through a first grounding element electrically connected to the first surge protection module electrically connected to the primary side of the rectifying module and a second grounding element electrically connected to the second surge protection module electrically connected to the secondary side of the rectifying module so that the conductive housing, the first grounding element, and the second grounding element have equal electrical potentials.

11. The high potential test method of claim 10, wherein before the step of fastening the fastening element to the conductive housing, the method further comprises:

connecting one terminal of the high potential test power to the primary side and grounding the other terminal;

providing the high voltage for the power supply device by the high potential test power and lasting for another predetermined time; and removing the high potential test power after another predetermined time.

12. The high potential test method of claim 10, wherein before the step of fastening the fastening element to the conductive housing, the method further comprises:

connecting one terminal of the high potential test power to the secondary side and grounding the other terminal;

providing the high voltage for the power supply device by the high potential test power and lasting for another predetermined time; and removing the high potential test power after another predetermined time.

* * * * *